United States Patent
Zhang

(10) Patent No.: US 8,928,826 B2
(45) Date of Patent: Jan. 6, 2015

(54) TFT-LCD ARRAY SUBSTRATE AND MANUFACTURING METHOD THEREOF

(75) Inventor: Mi Zhang, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 98 days.

(21) Appl. No.: 13/102,264

(22) Filed: May 6, 2011

(65) Prior Publication Data
US 2011/0273640 A1 Nov. 10, 2011

(30) Foreign Application Priority Data
May 7, 2010 (CN) .......................... 2010 1 0171460

(51) Int. Cl.
G02F 1/1333 (2006.01)
G02F 1/13 (2006.01)
H01L 27/12 (2006.01)
G02F 1/1362 (2006.01)

(52) U.S. Cl.
CPC .............. H01L 27/12 (2013.01); G02F 1/1309 (2013.01); G02F 1/136259 (2013.01); H01L 27/1214 (2013.01); G02F 2001/136254 (2013.01)
USPC .......................................................... 349/40

(58) Field of Classification Search
CPC ............ G02F 1/136286; G02F 1/1309; G02F 1/136259; G02F 2001/136254; G09G 3/006
See application file for complete search history.

(56) References Cited

U.S. PATENT DOCUMENTS 6,100,949 A * 8/2000 Kim ................................. 349/40
7,154,183 B2 * 12/2006 Fujimaki ....................... 257/774
2004/0227746 A1 * 11/2004 Shih .............................. 345/204
2005/0094045 A1 * 5/2005 Chae ............................... 349/40
2005/0139837 A1 * 6/2005 Lee et al. ......................... 257/72
2006/0208985 A1 * 9/2006 Hwang et al. .................. 345/92
2006/0284633 A1 12/2006 Park
2007/0126969 A1 * 6/2007 Kimura et al. ................ 349/141
2007/0284578 A1 12/2007 Yoon
2010/0053530 A1 * 3/2010 Peng et al. ..................... 349/139
2010/0085499 A1 * 4/2010 Hirato ............................. 349/39

FOREIGN PATENT DOCUMENTS

CN           1693956 A       11/2005
CN           1773357 A        5/2006
CN       101546774 A         9/2009

OTHER PUBLICATIONS

First Chinese Office Action dated Jul. 17, 2013; Appln No. 201010171460.2.

* cited by examiner

*Primary Examiner* — Bumsuk Won
*Assistant Examiner* — Ryan Crockett
(74) *Attorney, Agent, or Firm* — Ladas & Parry LLP

(57) ABSTRACT

A thin film transistor liquid crystal display (TFT-LCD) array substrate having a display area and a first thin film transistor (TFT) formed in each sub-pixel area defined by the gate line and data line which are crossed with each other; and a test area including a first test line, a second test line, a testing electrode and a second TFT, and the common electrode line extending to the test area from the display area such that a part of the second test line forms a gate electrode of the second TFT; the source electrode of the second TFT is electrically connected with the first test line; a drain of the second TFT is electrically connected with the common electrode line; and the common electrode line is connected with the testing electrode.

8 Claims, 13 Drawing Sheets

A4-A4

D4-D4

A1-A1

A2-A2

D2-D2

A3-A3

B4-B4

B1-B1

B2-B2

B3-B3

C4-C4

TFT-LCD ARRAY SUBSTRATE AND MANUFACTURING METHOD THEREOF

BACKGROUND

Embodiments of the present invention relate to a thin film transistor liquid crystal display (TFT-LCD) array substrate and a manufacturing method thereof.

A thin film transistor liquid crystal display (TFT-LCD) is formed by bonding an array substrate and a color filter substrate with each other. A TFT-LCD has advantages such as small volume, low power consumption and non-radiation, and therefore tend to dominate the current flat display market.

FIG. 10 is a partial top view schematically showing the structure of a conventional TFT-LCD array substrate. The array substrate 100 comprises gate lines 2a, common electrode lines 6b and data lines 6a. The gate lines 2a and the data lines 6a are crossed with each other and define sub-pixel areas, and a first thin film transistor (TFT) T1 is formed in each sub-pixel area. Each first TFT T1 comprises a gate electrode 2b, a source electrode 6d and a drain electrode 6e. The gate electrode 2b is connected with one gate line 2a, the source electrode 6d is connected with one data line 6a, and the drain electrode 6e is connected with a pixel electrode 8c through a via hole 7d in the sub-pixel area. For each sub pixel, the common electrode line 6b and the pixel electrode 8c overlap with each other and provide a storage capacitor, and the storage capacitor can keep the electrical signal applied to the pixel electrode 8c for a period of time for displaying.

In the conventional array substrate, the common electrode lines are connected with each other generally. The common electrode lines on the array substrate are applied with a same common voltage, and therefore, the voltage in some of the common electrode lines cannot be adjusted individually to perform the partial test during testing.

SUMMARY

One embodiment of the invention provides a thin film transistor liquid crystal display (TFT-LCD) array substrate, comprising: a display area comprising a gate line, a data line and a common electrode line, a pixel electrode and a first thin film transistor (TFT) formed in each sub-pixel area defined by the gate line and data line which are crossed with each other; and a test area located at the peripheral of the display area and comprising a first test line, a second test line, a testing electrode and a second TFT, and the common electrode line extending to the test area from the display area, wherein a part of the second test line constitutes a gate electrode of the second TFT; the source electrode of the second TFT is electrically connected with the first test line; a drain of the second TFT is electrically connected with the common electrode line; and the common electrode line is connected with the testing electrode.

Another embodiment of the invention provides a manufacturing method for a thin film transistor liquid crystal display (TFT-LCD) array substrate, comprising: Step 1, forming a gate line, a data line, a common electrode line, a first test line, a second test line, a source electrode and a drain electrode of a first TFT, an active layer member of the first TFT, a source electrode and drain electrode of a second TFT, and an active layer member of the second TFT on a base substrate; a part of the second test line constituting a gate electrode of the second TFT, and the first TFT being formed in a sub-pixel area defined by the gate line and the data line which are crossed with each other; Step 2, forming a passivation layer on the substrate after Step 1, and forming a testing via hole over one end, which is adjacent to the second TFT, of the common electrode line by a patterning process; and Step 3, forming a transparent conductive film on a substrate after Step 2, forming a testing electrode and a pixel electrode by a patterning process, and the testing electrode being connected with the common electrode line through the testing via hole.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein:

FIG. 1b is a side sectional view taken along a line A4-A4 in FIG. 1a.

FIG. 2b is a side sectional view taken along a line A1-A1 in FIG. 2a.

FIG. 3b is a side sectional view taken along a line A2-A2 in FIG. 3a.

FIG. 4b is a side sectional view taken along a line A3-A3 in FIG. 4a;

FIG. 5b is a side sectional view taken along a line B4-B4 in FIG. 5a;

FIG. 6b is a side sectional view taken along a line B1-B1 in FIG. 6a;

FIG. 7b is a side sectional view taken along a line B2-B2 in FIG. 7a;

FIG. 8b is a side sectional view taken along a line B3-B3 in FIG. 8a;

FIG. 9b is a side sectional view taken along a line C4-C4 in FIG. 9a.

DETAILED DESCRIPTION

Figure 1A:
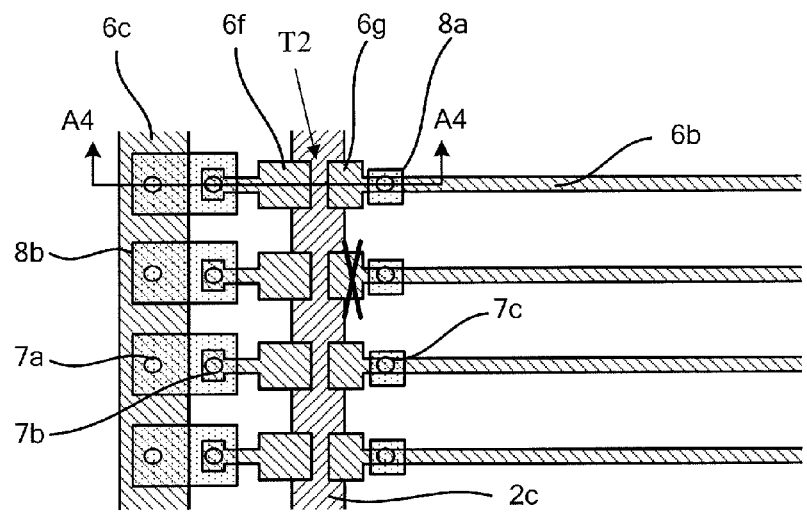
FIG. 1a is a partial top view schematically showing the structure of a TFT-LCD array substrate according to a first embodiment of the invention.
Figure 1B:
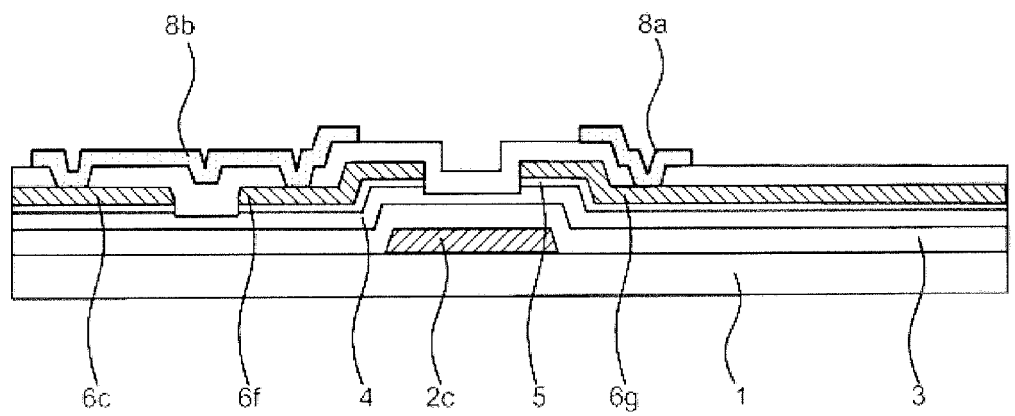

FIG. 1a is a partial top view schematically showing the structure of a TFT-LCD array substrate according to a first embodiment of the invention; and FIG. 1b is a side sectional view taken along a line A4-A4 in FIG. 1a.

The array substrate 200 comprises a plurality of gate lines, a plurality of data lines and a plurality of common electrode lines 6b. A pixel electrode and a first TFT T1 are formed in each of the sub-pixel areas defined by the gate lines and the data lines which are crossed with each other. The structures of the gate lines, the data lines and the first TFTs in the sub-pixel areas may be the same as those shown in FIG. 10 and therefore are not shown in FIG. 1a. The array substrate 200 further comprises a first test line 6c, a second test line 2c, a testing electrode 8a and a second TFT T2 for each common electrode line 6b, and a part of the second test line 2c constitutes the gate electrode of the second TFT T2. The source electrode 6f of the second TFT is connected with the first test line 6c, and the drain electrode 6g of the second TFT T2 is connected with the corresponding common electrode line 6b. Each common electrode line 6b is connected with respective testing electrode 8a. The array substrate 200 according to the first embodiment of the invention can be divided into a display area and a test area, and the test area is located at the peripheral of the display area. The gate lines, data lines, the common electrode lines 6b and so on are formed in the display area, the first test line 6c, the second test line 2c, the testing electrodes 8a, the second TFTs T2 and so on are formed in the test area, and the common electrode lines 6b also extend into the test area so as to be electrically connected with the drain electrodes 6g of the second TFTs T2.

Specifically, for each row, a first connecting via hole 7a is formed over the first test line 6c, and a second connecting via hole 7b is formed over the source electrode 6f of the second TFT T2. The source electrode 6f of the second TFT T2 is connected with a first connecting electrode 8b through the second connecting via hole 7b, and the first test line 6c is connected with the first connecting electrode 8b through the first connecting hole 7a.

In the embodiment, the first test line 6c and the second TFT T2 are provided in the peripheral area other than the sub-pixel areas, i.e., in a test area, on the array substrate.

In the first embodiment, the source/drain electrodes of the second TFT are formed above the second test line, i.e., the second TFT is a bottom gate type transistor. However, the second TFT according to an embodiment of the invention is not limited to the bottom gate type transistor, and can also be a top gate type transistor.

Figure 1C:
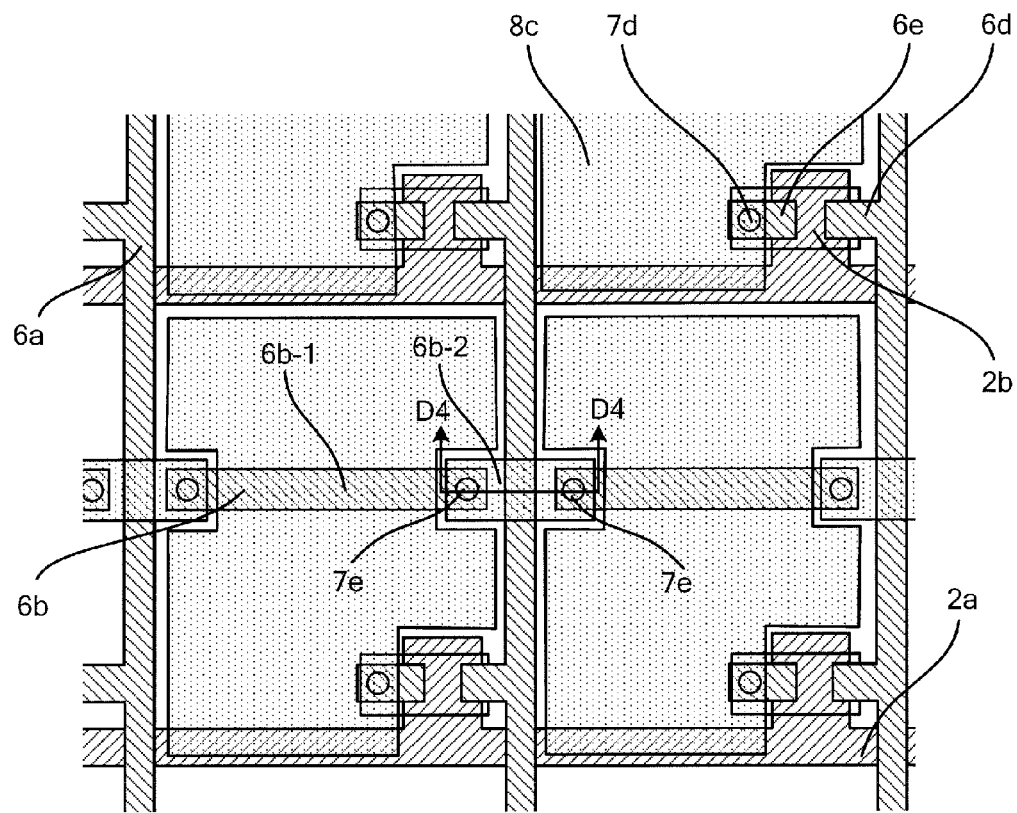
FIG. 1c is a partial top view of a common electrode line and a data line of the TFT-LCD array substrate according to the first embodiment of the invention.
Figure 1D:
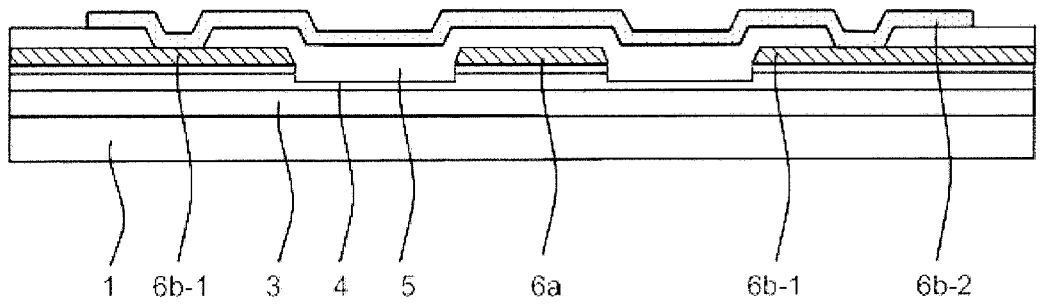
FIG. 1d is a side sectional view taken along a line D4-D4 in FIG. 1c.
Figure 10:
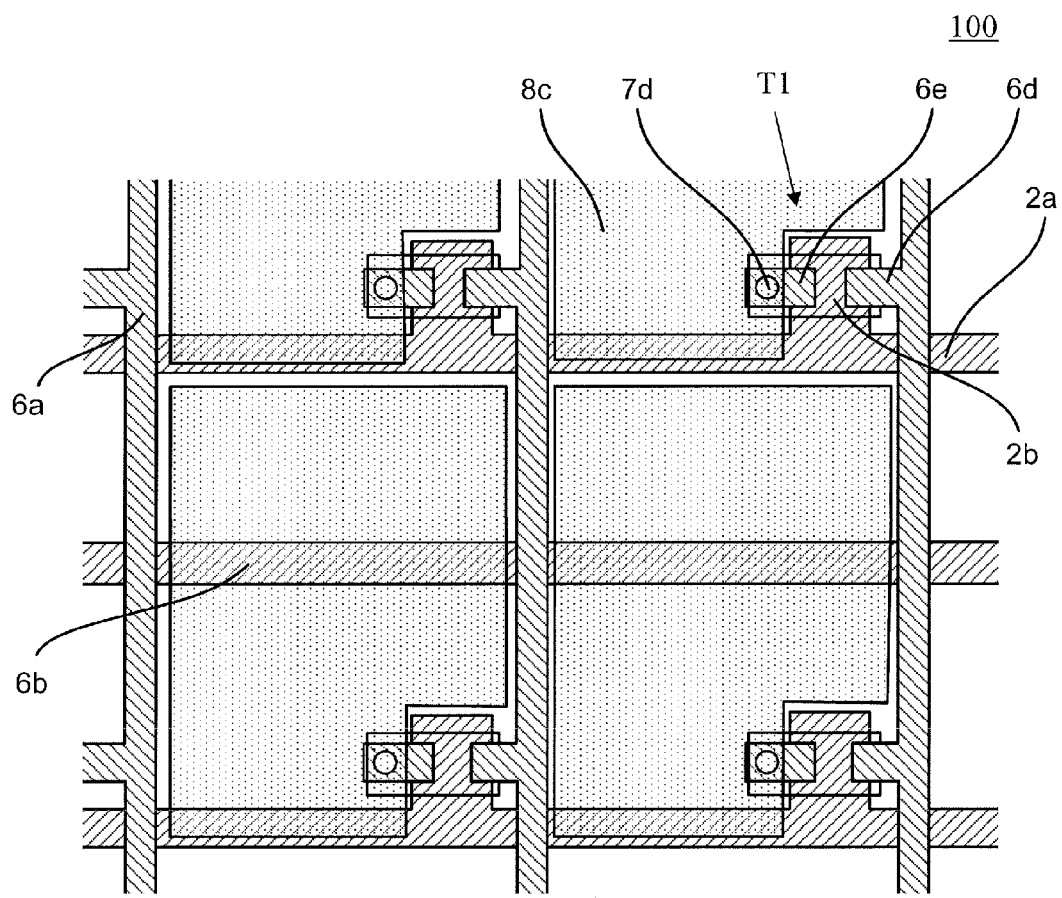
FIG. 10 is a partial top view schematically showing a conventional TFT-LCD array substrate.

In the first embodiment, the common electrode lines 6b and the data lines are formed in a same patterning process. However, the common electrode lines 6b and the date lines cannot be connected with each other; therefore, the structure of the common electrode lines 6b according to the first embodiment is different from the that of the common electrode lines 6b as shown in FIG. 10. FIG. 1c is a partial top view showing the common electrode lines and the data lines of the TFT-LCD array substrate according to the first embodiment of the invention; and FIG. 1d is a side sectional view taken along a line D4-D4 in FIG. 1c.

In the first embodiment, each common electrode line 6b comprises a plurality of common electrode strips 6b-1 and a plurality of second connecting electrodes 6b-2; one common electrode strips 6b-1 is formed in each sub-pixel area. In the sub-pixel areas in one row, the common electrode strips in two adjacent sub-pixel areas are connected with same one intermediate second connecting electrode 6b-2. A fourth connecting hole 7e is formed over each of two ends of each common electrode strip 6b-1. In the sub-pixel areas in the same row, the common electrode strips 6b-1 in two adjacent sub-pixels are connected with each other through the fourth connecting holes 7e and the intermediate second connecting electrode 6b-2.

As for the outer common electrode strip connected with the drain electrode of the second TFT outside the sub-pixel areas, its end which is adjacent to the second TFT in the same row is connected with the drain electrode of the second TFT, and the other end thereof is connected with the adjacent common electrode strip through one fourth connecting via hole and one second connecting electrode.

The testing principle for the TFT-LCD array substrate provided in the embodiment is described as follows.

In the normal operation state of the TFT-LCD, voltages can be applied to the first test line 6c and the second test line 2c, respectively. After a turn-on voltage is applied to the second test line 2c, second TFTs T2 connected with the various common electrode lines 6b are turned on, and then the voltage applied to the first test line 6c can be applied to each common electrode line 6b. If it is necessary to test a certain common electrode line 6b individually, then no turn-on voltage is applied to the second test line 2c, and therefore, the second TFTs connected with the common electrode lines 6b are turned off; at this time, a test voltage is applied to the testing electrode 8a connected with the common electrode line 6b to be tested. If it is necessary to apply the same test voltage to most of the common electrode lines 6b but apply a different test voltage to the rest common electrode lines 6b, then a turn-on voltage and a test voltage are applied to the second test line and the first test line, respectively, and each second TFT is turned on; at the same time, the circuit path between the common electrode line 6b which is to be applied with a different test voltage and the corresponding second TFT is cut off (e.g., at the position shown with a mark "X" in FIG. 1a), and the different test voltage is individually applied to the common electrode line 6b through the corresponding testing electrode 8a. After the testing, the cut-off portion of the circuit path can be connected again, for example, by laser welding.

The TFT-LCD array substrate according to the embodiment comprises second TFTs connected with the respective common electrode lines, each second TFT can be turned on when a turn-on voltage is applied to the second test line 2c, and therefore, the test voltage over the first test line 6c can be applied to each common electrode line 6b. If it is needed to test a certain common electrode line 6b individually, then no turn-on voltage is applied to the second test line 2c and each second TFT is turned off. At this time, the test voltage can be applied to the certain common electrode line 6*b* individually through the corresponding testing electrode 8*a*. The TFT-LCD array substrate according to the embodiment can use only some of the common electrode lines for the purpose of a partial test while ensure the normal operation of the TFT-LCD array substrate.

FIGS. 2*a*-4*c* are schematic views showing the manufacturing process of the TFT-LCD array according to the first embodiment of the invention. The technical solutions according to the embodiment of the invention are further described with following examples of manufacturing process. In the following description, the patterning process may comprise steps such as applying photoresist, masking, exposing and developing of photoresist, etching, removing photoresist, etc. Herein, positive photoresist is used as an example of photoresist used in a patterning process.

Figure 2A:
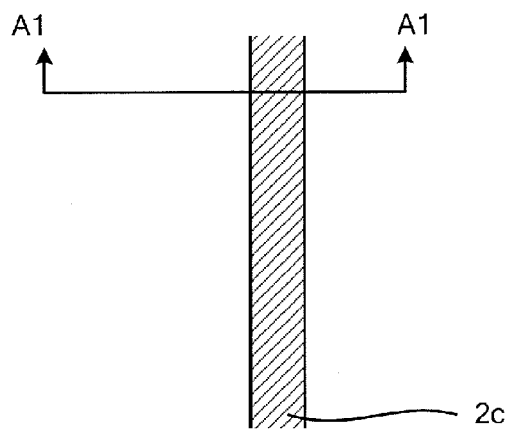
FIG. 2a is a partial top view schematically showing the structure of the TFT-LCD array substrate after a first patterning process according to the first embodiment of the invention.
Figure 2B:
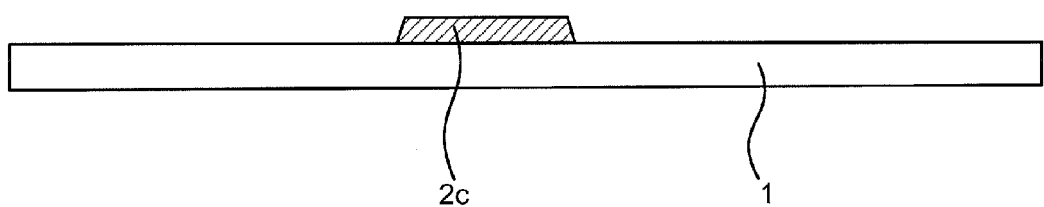

FIG. 2*a* is a partial top view schematically showing the structure of the TFT-LCD array substrate after a first patterning process according to the first embodiment of the invention; FIG. 2*b* is a side sectional view taken along a line A1-A1 in FIG. 2*a*.

Firstly, a gate metal layer thin film with a thickness of 100 to 700 nm is deposited on a base substrate 1, such as a glass substrate or a plastic substrate, by magnetic sputtering, thermal evaporation or another film-forming method. The material of the gate metal layer thin film comprises a metal material such as molybdenum, aluminum, aluminum neodymium alloy, tungsten, chromium, copper or any alloy thereof. The gate metal layer thin film is patterned by a patterning process with a normal mask so as to form the patterns including a gate line, a gate electrode and a second test line 2*c* on the substrate 1.

FIGS. 2*a*-4*c* mainly show the structure of the second TFTs, the first test line 6*c* and the common electrode lines 6*b*, but not show structures such as the gate lines, the data lines, the pixel electrodes and the first TFTs connected with the pixel electrodes in the display area. The structures such as the gate lines, the data lines, the pixel electrodes and the first TFTs connected with the pixel electrodes, can be referred to FIG. 10.

Figure 3A:
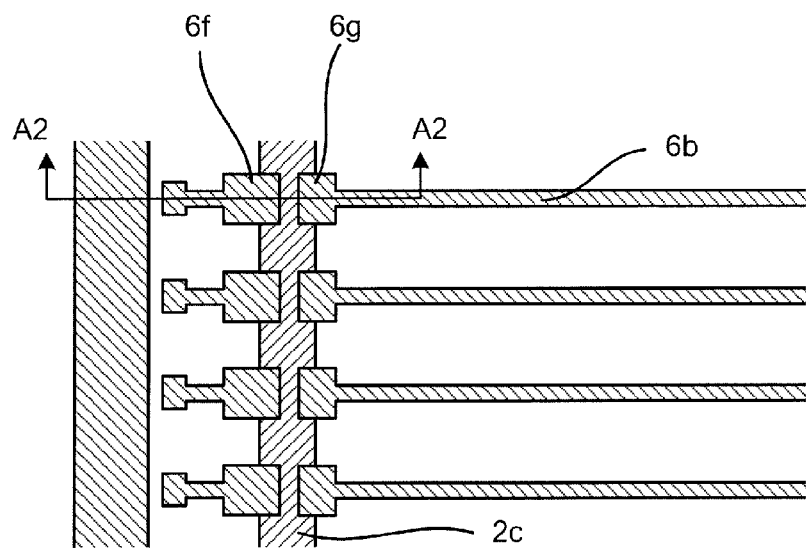
FIG. 3a is a partial top view schematically showing the structure of the TFT-LCD array substrate after a second patterning process according to the first embodiment of the invention.
Figure 3B:
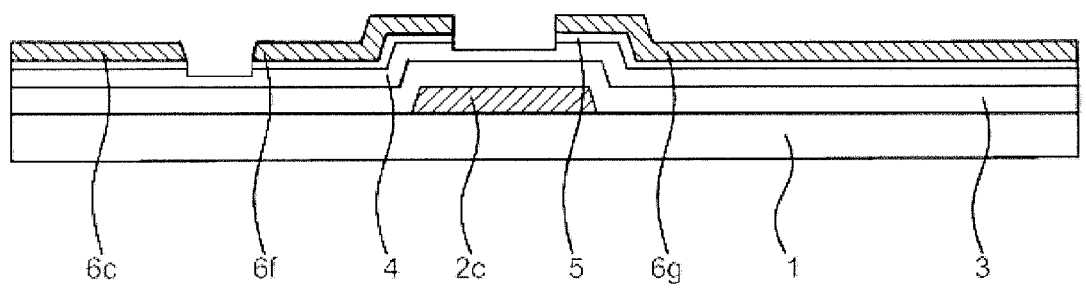
Figure 3C:
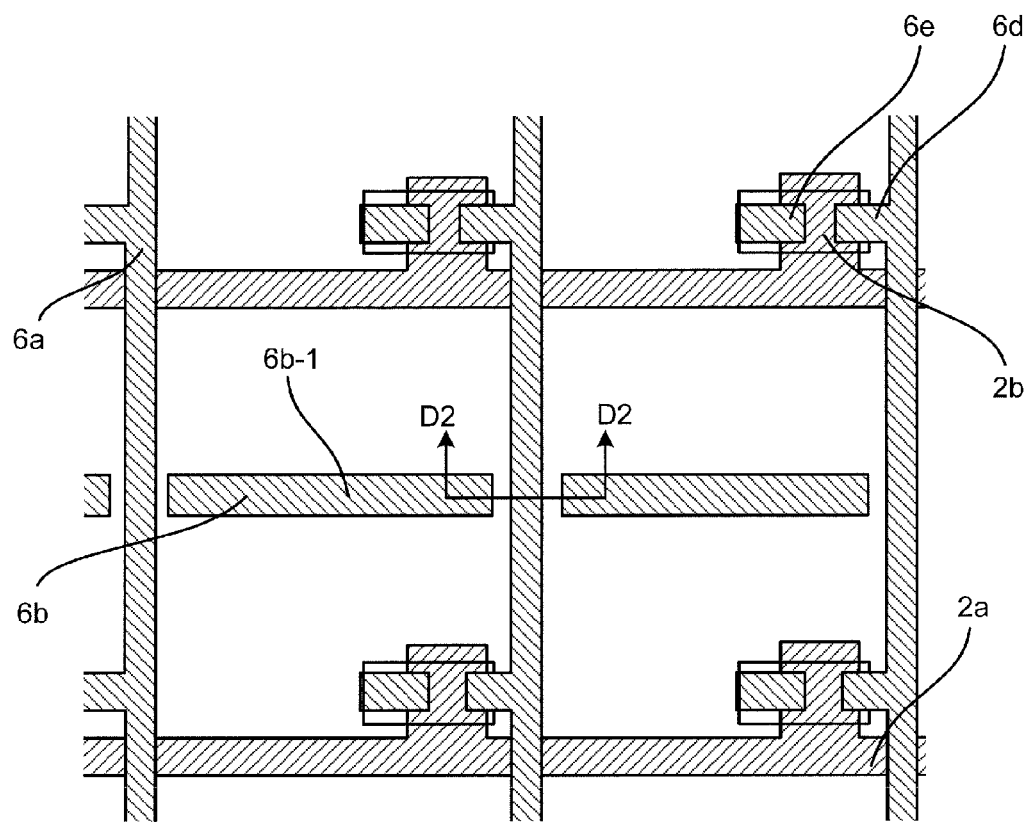
FIG. 3c is a partial top view schematically showing the structure of the common electrode line of the TFT-LCD array substrate formed after the second patterning process according to the first embodiment of the invention.
Figure 3D:
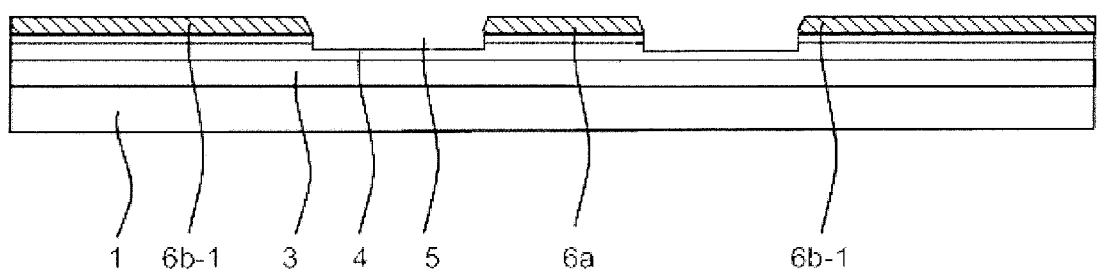
FIG. 3d is a side sectional view taken along a line D2-D2 in FIG. 3c.

FIG. 3*a* is a partial top view schematically showing the structure of the TFT-LCD array substrate after a second patterning process according to the first embodiment of the invention; FIG. 3*b* is a side sectional view taken along a line A2-A2 in FIG. 3*a*; FIG. 3*c* is a partial top view schematically showing the structure of the common electrode line of the TFT-LCD array substrate formed after the second patterning process according to the first embodiment of the invention; and FIG. 3*d* is a side sectional view taken along a line D2-D2 in FIG. 3*c*.

On the substrate 1 with the patterns as shown in FIG. 2*a*, a gate insulating layer thin film 3 with a thickness of 100 to 600 nm, a semiconductor layer thin film 4 with a thickness of 1000 to 3000 Å and a doped semiconductor layer thin film 5 with a thickness of 100 to 600 nm are deposited sequentially by chemical vapor deposition or another film-forming method. Then, a layer of source/drain metal thin film 5 is deposited by magnetic sputtering, thermal evaporation or another film-forming method. The material of the source/drain metal thin film comprises a single layer of a metal material such as molybdenum, aluminum, aluminum neodymium alloy, tungsten, chromium, or copper, or composite film composed of the single layers of the above metal materials. The semiconductor layer thin film, the doped semiconductor layer thin film and the source/drain metal thin film are patterned by a patterning process with a half-tone or grey tone mask so as to form the patterns including data lines 6*a*, common electrode strips 6*b*-1, a first test line 6*c*, source electrodes 6*d* and drain electrodes 6*e* of first TFTs, source electrodes 6*f* and drain electrodes 6*g* of second TFTs, the active layer members (or islands) of the first TFTs and the active layer members (or islands) of the second TFTs. The active layer comprises a semiconductor layer thin film and a doped semiconductor thin film, which are stacked in order, and is patterned to form the active members, in a shape of island, of the first TFTs and second TFTs.

The second patterning process in the embodiment of the invention is a multiple-step etching process. The process is described specifically as follows. First, a layer of photoresist is applied on the source/drain metal thin film, and is exposed with a half-tone or grey tone mask, so that the photoresist is formed into a completely-exposed area, an unexposed area and a partially-exposed area. The unexposed area includes the area where the patterns including the data lines, the common electrode strips, the first test line, and source electrodes and drain electrodes of the first and second TFTs are to be disposed. The partially-exposed area includes an area corresponding to the active layer members (or islands) of the first and second TFTs, and the completely-exposed area includes the area other than the above-mentioned areas. After development, the thickness of the photoresist in the unexposed area is not substantially changed so as to form a photoresist-completely-remained area; the photoresist in the completely-exposed area are removed completely so as to form a photoresist-completely-removed area; and the thickness of the photoresist in the partially-exposed area is reduced so as to from a photoresist-partially-remained area. By a first etching process, the source/drain metal thin film, the doped semiconductor layer thin film and the semiconductor layer thin film in the completely-exposed area are etched away so as to form the patterns including the active layer member, the data lines, the common electrode strips and the first test line. By an ashing process, the photoresist in the partially-exposed area is removed so as to expose the source/drain metal thin film in the area, but the photoresist-completely-remained area is still covered by the remaining photoresist. By a second etching process, the source/drain metal thin film and the doped semiconductor layer thin film exposed after the ashing process in the partially-exposed area are etched away, and the semiconductor layer thin film is partially etched in the thickness direction so as to expose the semiconductor layer thin film, and therefore, the source and drain electrodes of the first and second TFTs are formed. At last, the remained photoresist is removed such as by lifting-off and the second patterning process is completed.

Figure 4A:
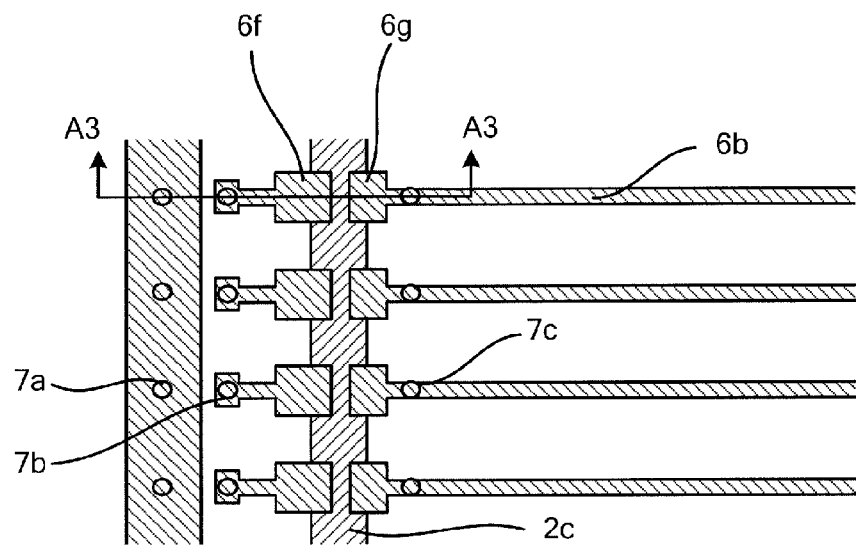
FIG. 4a is a partial top view schematically showing the structure of the TFT-LCD array substrate after a third patterning process according to the first embodiment of the invention.
Figure 4B:
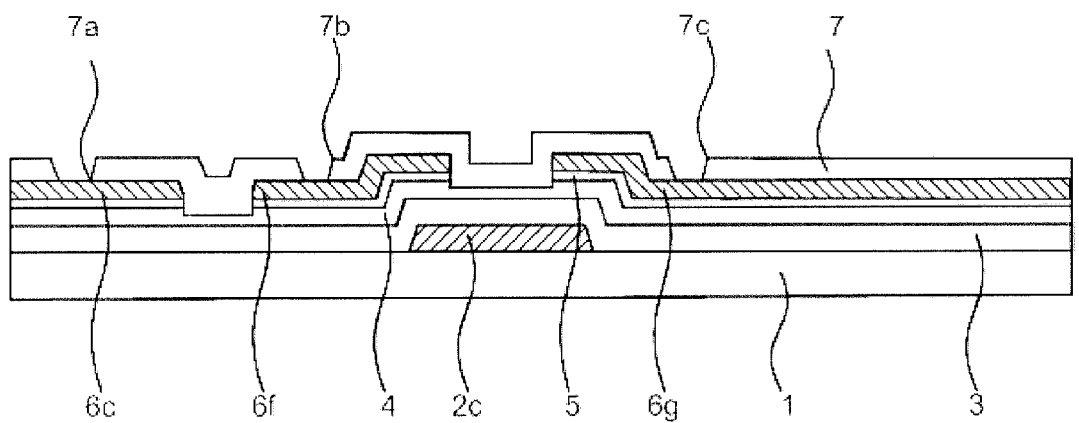
Figure 4C:
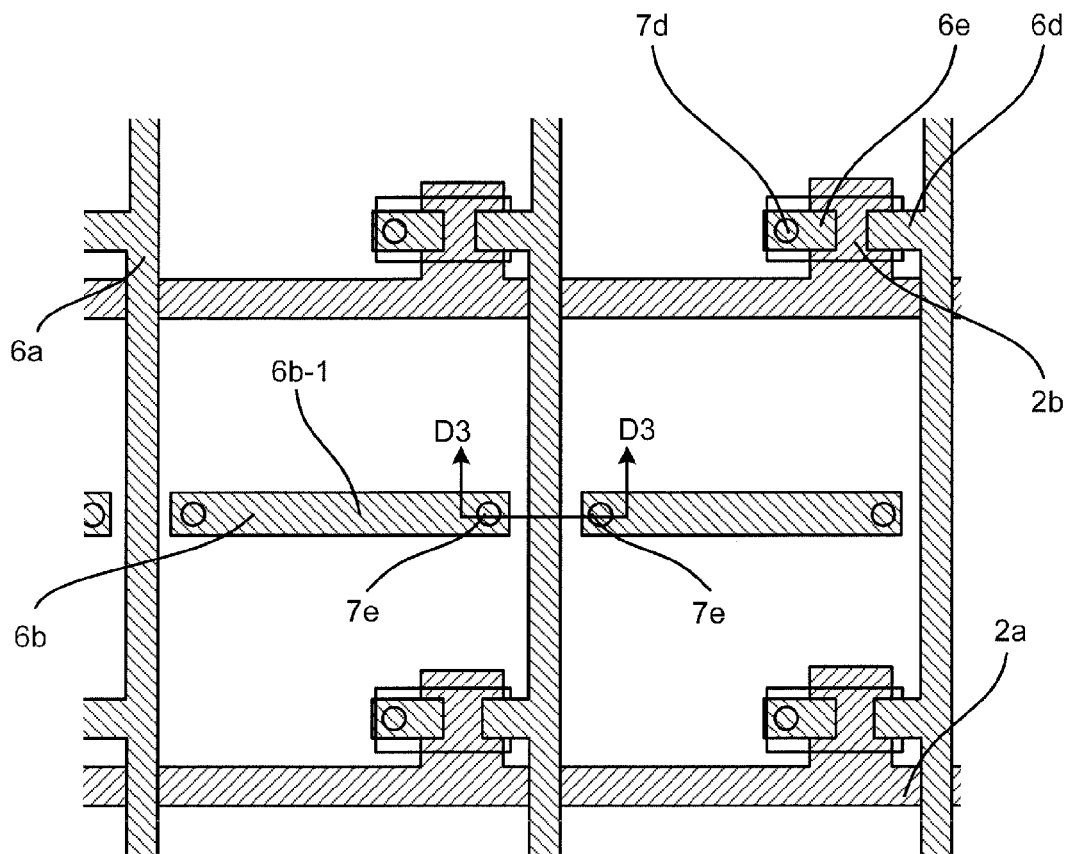
FIG. 4c is a partial top view schematically showing the structure of the common electrode line of the TFT-LCD array substrate formed after the third patterning process according to the first embodiment of the invention.
Figure 4D:
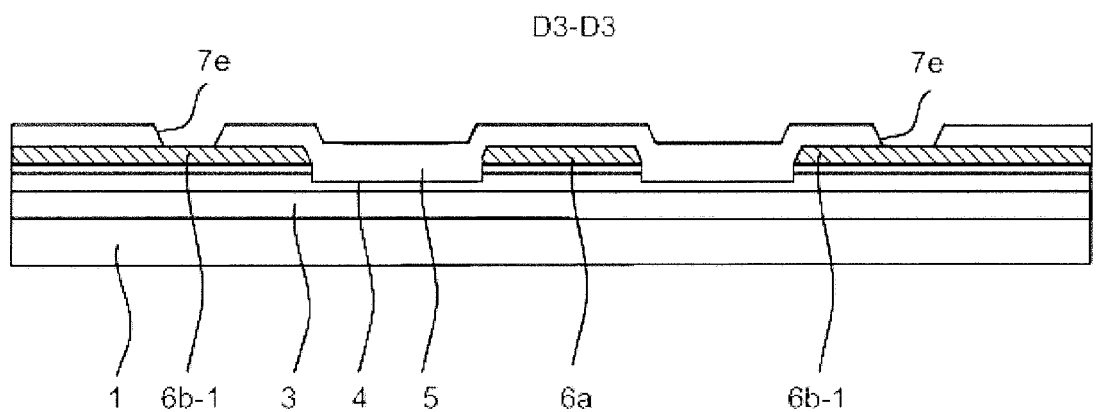
FIG. 4d is a side sectional view taken along a line D3-D3 in FIG. 4c.

FIG. 4*a* is a partial top view schematically showing the structure of the TFT-LCD array substrate after a third patterning process according to the first embodiment of the invention; FIG. 4*b* is a side sectional view taken along a line A3-A3 in FIG. 4*a*; FIG. 4*c* is a partial top view schematically showing the structure of the common electrode strips of the TFT-LCD array substrate formed after the third patterning process according to the first embodiment of the invention; and FIG. 4*d* is a side sectional view taken along a line D3-D3 in FIG. 4*c*.

On the substrate 1 with the patterns as shown in FIGS. 3*a* and 3*c*, a passivation layer 7 with a thickness of 100 to 600 nm is deposited by chemical vapor deposition or another film-forming method. The material of the passivation layer comprises silicon nitride (SiNx), silicon dioxide or the like. A patterning process is performed on the passivation layer thin film with a normal mask, wherein first connecting via holes 7*a* are formed at the locations over the first test line 6*c*, and second connecting via holes 7b are formed at the locations over the source electrodes 6f of the second TFTs, testing via holes 7c are formed over the ends, adjacent to the corresponding second TFTs, of common electrode strips, fourth connecting via holes 7e are formed over two ends of common electrode strips 6b-1 in the sub-pixel areas, and via holes 7d for connecting the pixel electrodes and the drain electrodes of the first TFTs are formed at the locations corresponding to the drain electrodes of the first TFTs. In the embodiment, the drain electrodes of the second TFTs are connected with the adjacent common electrode strips directly, i.e., they are formed integrally in the pattering process.

At last, on the substrate with the patterns as shown in FIGS. 4a and 4c, a layer of transparent conductive thin film is deposited by magnetic sputtering, thermal evaporation or another film-forming method. The material of the transparent conductive thin film comprises indium tin oxide (ITO), indium zinc oxide (IZO), or a high molecular transparent conductive material. A pixel electrode 8c is formed in each sub-pixel area by a fourth patterning process with a normal mask, and first connecting electrodes 8b and testing electrodes 8a are formed in the test area. Each pixel electrode 8c is connected with the drain electrode of the first TFT in the corresponding sub-pixel area through one via hole 7d, each testing electrode 8a is connected with the corresponding common electrode strip 6b-1 through one via hole 7c, the first test line 6c is connected with each first connecting electrode 8b through one first connecting via hole 7a, the source electrode 6f of each second TFT is connected with the corresponding first connecting electrode 8b through one second connecting via hole 7b, so that the first test line 6c and the source electrodes 6f of the second TFTs can be electrically connected together. Within each sub-pixel area, the pixel electrode 8c and a second connecting electrode 6b-2 are formed, and the second connecting electrode 6b-2 connects the common electrode strips 6b-1 in two adjacent sub-pixel areas through two fourth connecting holes 7e. The partial top view and the sectional view of the array substrate after the fourth patterning process are shown in FIGS. 1a, 1b, 1c and 1d.

Figure 5A:
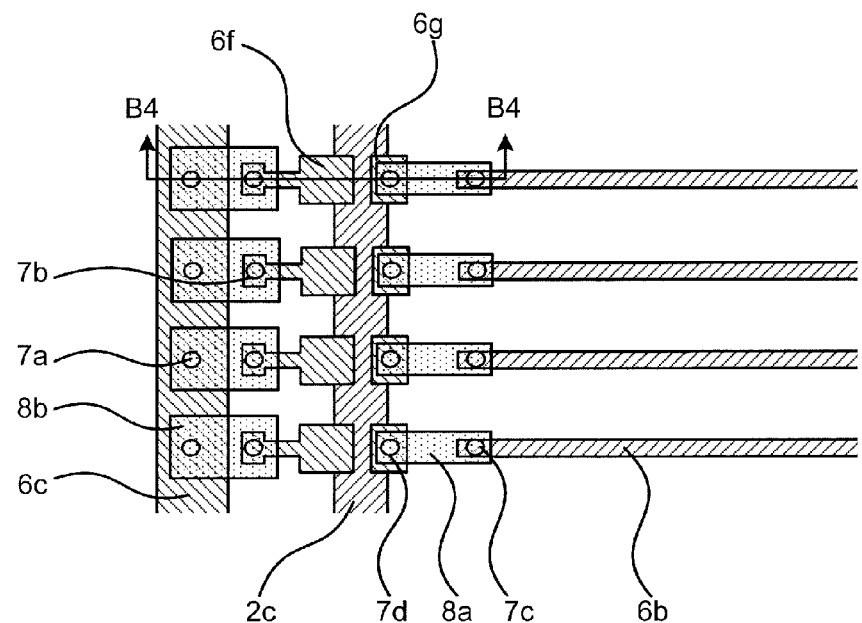
FIG. 5a is a partial top view schematically showing the structure of a TFT-LCD array substrate according to a second embodiment of the invention.
Figure 5B:
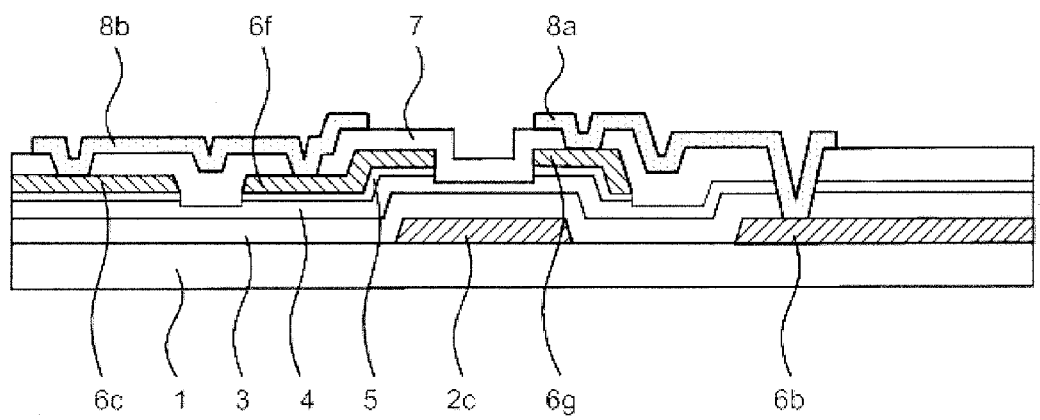

FIG. 5a is a partial top view schematically showing the structure of a TFT-LCD array substrate according to a second embodiment of the invention; and FIG. 5b is a side sectional view taken along a line B4-B4 in FIG. 5a. The second embodiment as shown in FIG. 5a is different from the first embodiment as shown in FIG. 1a in that: in the second embodiment, the common electrode lines, the second test line and the gate lines are formed in the same patterning process; in the first embodiment, the common electrode lines and the source/drain electrodes of the second TFTs are formed in the same patterning process, and the gate lines are formed in another patterning process. Hereinafter, the forming process for the second embodiment is described.

Figure 6A:
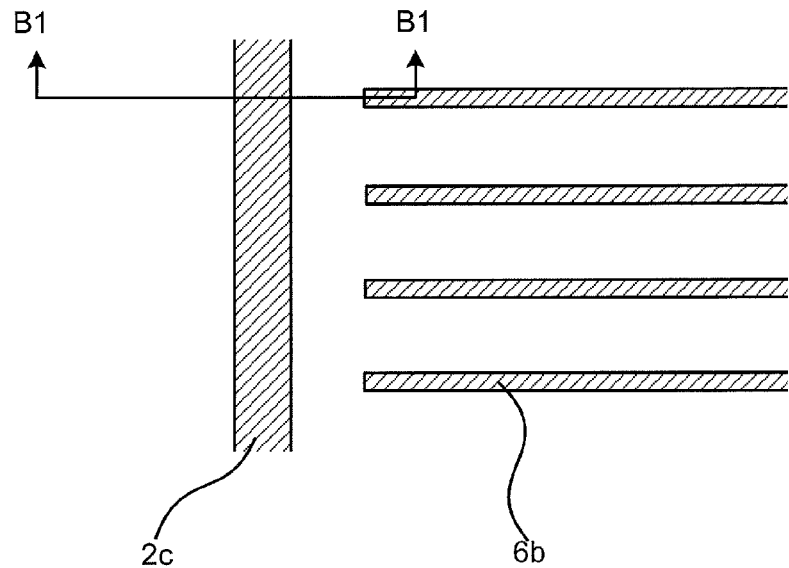
FIG. 6a is a partial top view schematically showing the structure of the TFT-LCD array substrate after a first patterning process according to the second embodiment of the invention.
Figure 6B:
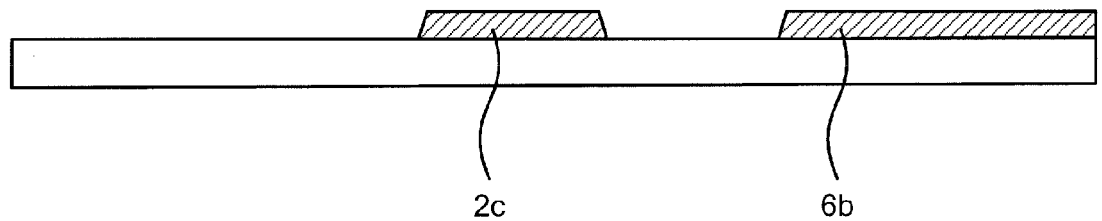

FIG. 6a is a partial top view schematically showing the structure of the TFT-LCD array substrate after a first patterning process according to the second embodiment of the invention; and FIG. 6b is a side sectional view taken along a line B1-B1 in FIG. 6a.

A gate metal layer thin film with a thickness of 100 to 700 nm is deposited on a base substrate 1, such as a glass substrate or a plastic substrate, by magnetic sputtering, thermal evaporation or another film-forming method. The gate metal layer thin film is patterned by a patterning process with a normal mask so as to form gate lines, gate electrodes, a second test line 2c, and common electrode lines 6bc on the base substrate 1.

Figure 7A:
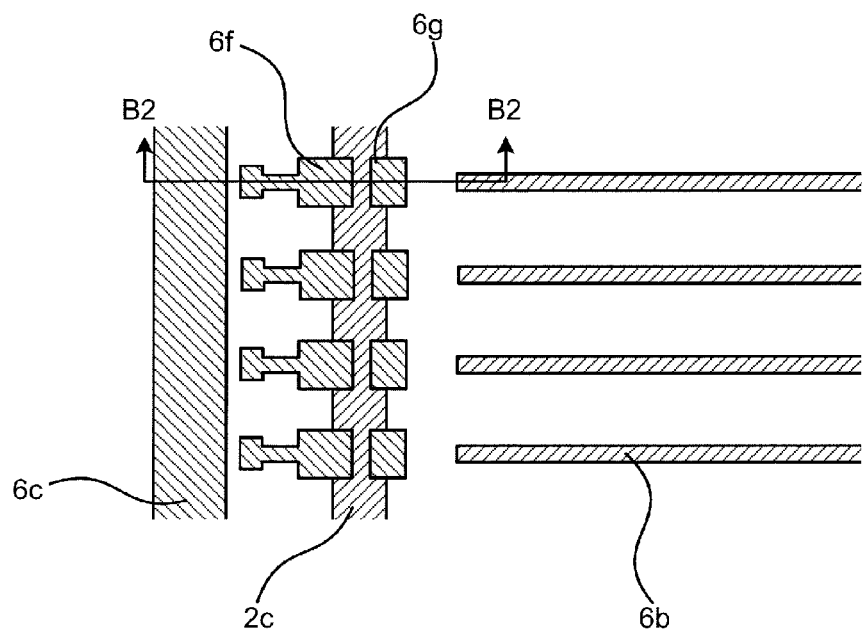
FIG. 7a is a partial top view schematically showing the structure of the TFT-LCD array substrate after a second patterning process according to the second embodiment of the invention.
Figure 7B:
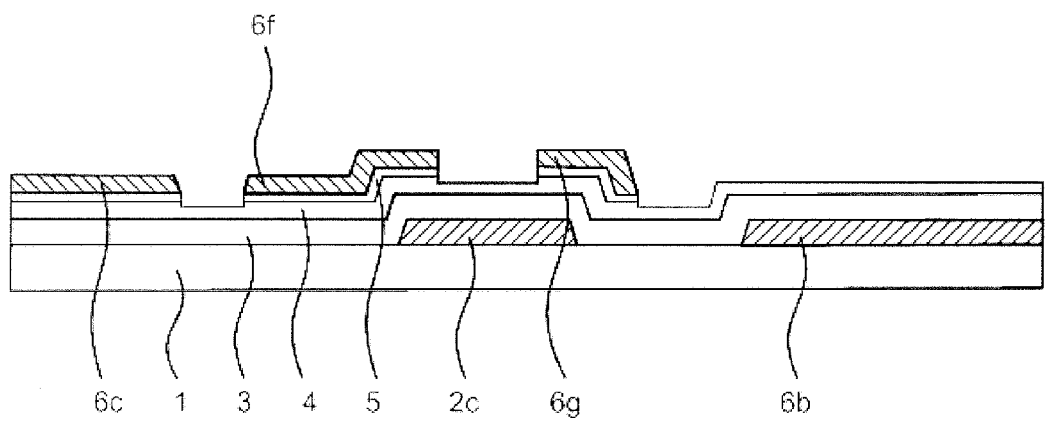

FIG. 7a is a partial top view schematically showing the structure of the TFT-LCD array substrate after a second patterning process according to the second embodiment of the invention; and FIG. 7b is a side sectional view taken along a line B2-B2 in FIG. 7a.

On the substrate 1 with the patterns as shown in FIG. 6a, a gate insulating layer thin film 3 with a thickness of 100 to 600 nm, a semiconductor layer thin film 4 with a thickness of 1000 to 3000 Å and a doped semiconductor layer thin film 5 with a thickness of 100 to 600 nm are deposited sequentially by chemical vapor deposition or another film-forming method. Then, a layer of source/drain metal thin film is deposited by magnetic sputtering, thermal evaporation or another film-forming method. The semiconductor layer thin film, the doped semiconductor layer thin film and the source/drain metal thin film are patterned by a patterning process with a half-tone or grey tone mask so as to faun data lines, a first test line 6c, source and drain electrodes of first TFTs, source electrodes 6f and drain electrodes 6g of second TFTs, active layer member (or islands) of the first and second TFTs.

Figure 8A:
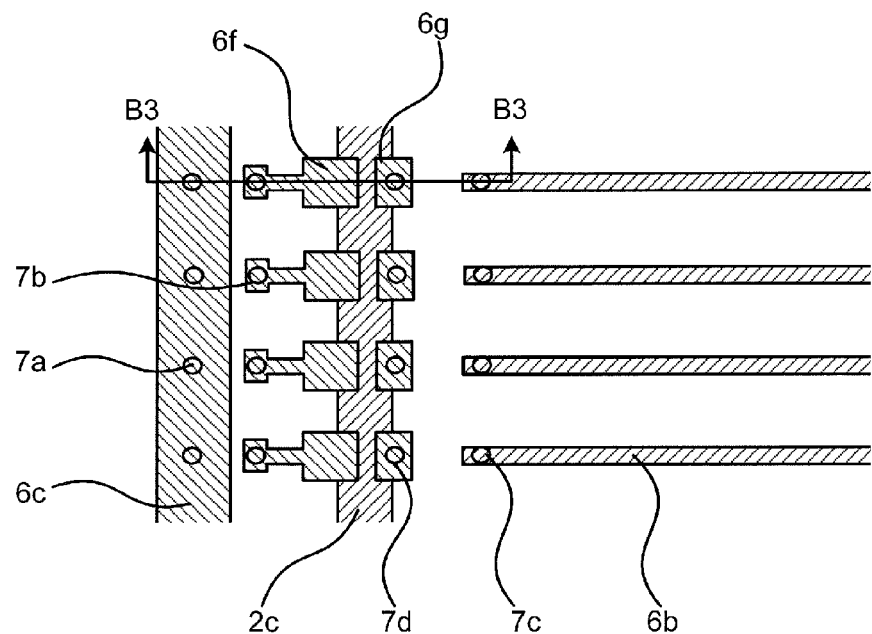
FIG. 8a is a partial top view schematically showing the structure of the TFT-LCD array substrate after a third patterning process according to the second embodiment of the invention.
Figure 8B:
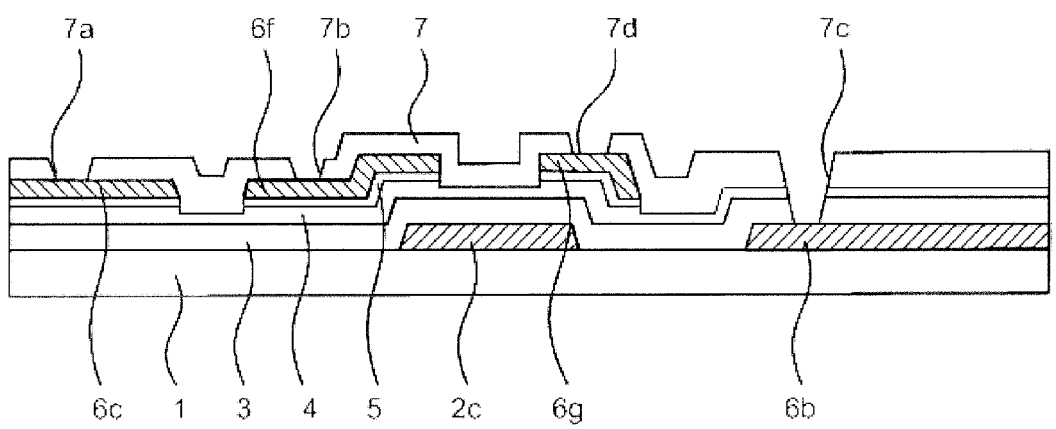

FIG. 8a is a partial top view schematically showing the structure of the TFT-LCD array substrate after a third patterning process according to the second embodiment of the invention; and FIG. 8b is a side sectional view taken along a line B3-B3 in FIG. 8a.

On the substrate 1 with the patterns shown in FIG. 7a, a passivation layer 7 with a thickness of 100 to 600 nm is deposited by chemical vapor deposition or another film-forming method. The passivation layer thin film is patterned by a patterning process with a normal mask, wherein first connecting via holes 7a are formed over the first test line 6c, and second connecting via holes 7b are formed over the source electrodes 6f of the second TFTs, third connecting via holes 7d are formed over the drain electrodes 6g of the second TFTs, and testing via holes 7c are formed over the common electrode lines 6b, respectively. A via hole for connecting the pixel electrode and the drain electrode of the first TFT in each sub-pixel areas is formed at the location corresponding to the drain electrode of the first TFT.

At last, on the substrate 1 with the patterns shown in FIG. 8a, a layer of transparent conductive thin film is deposited by magnetic sputtering, thermal evaporation or other film-forming methods. The materials of the transparent conductive thin film comprises indium tin oxide (ITO), indium zinc oxide (IZO) or a high molecular conductive transparent material. By a fourth patterning process with a normal mask, a pixel electrode is formed in each sub-pixel area, and first connecting electrodes 8b and testing electrodes 8a are formed in the area other than the sub-pixel areas, i.e., in the test area. In each sub-pixel area, the pixel electrode is connected with the drain electrode of the first TFT through one via hole. In the embodiment, the common electrode lines are not connected with the drain electrodes of the second TFTs directly. The testing electrodes 8a are connected with the corresponding common electrode lines 6b through the testing via holes 7c, and connected with the drain electrodes 6g of the second TFTs through the third connecting via holes 7d, respectively. The first test line 6c is connected with the first connecting electrodes 8b through the first connecting via holes 7a, and the source electrodes 6f of the second TFTs are connected with the first connecting electrodes 8b through the second connecting via holes 7b. The partial top view and the sectional view of the array substrate after the fourth patterning process are shown in FIGS. 5a and 5b.

In the second embodiment, the common electrode lines, the gate lines and the second test line are formed in the same patterning process; therefore, the common electrode lines are not connected with the data lines.

Figure 9A:
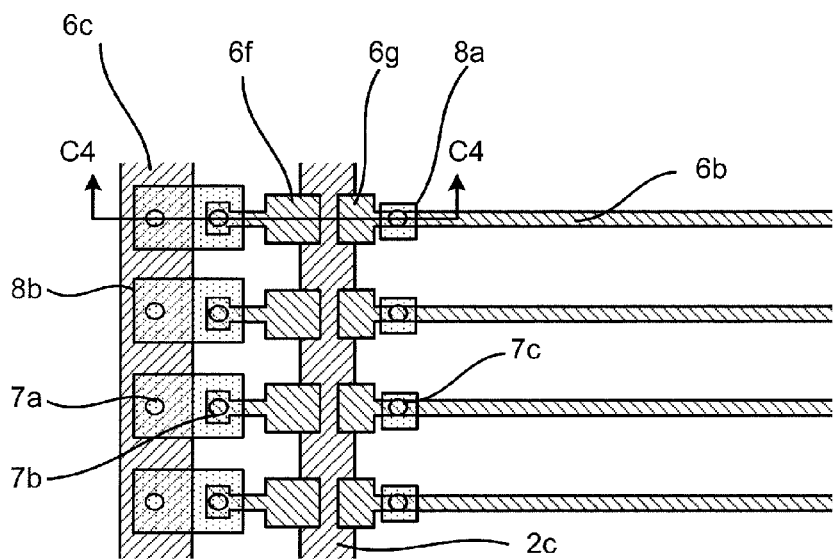
FIG. 9a is a partial top view schematically showing the structure of a TFT-LCD array substrate according to a third embodiment of the invention.
Figure 9B:
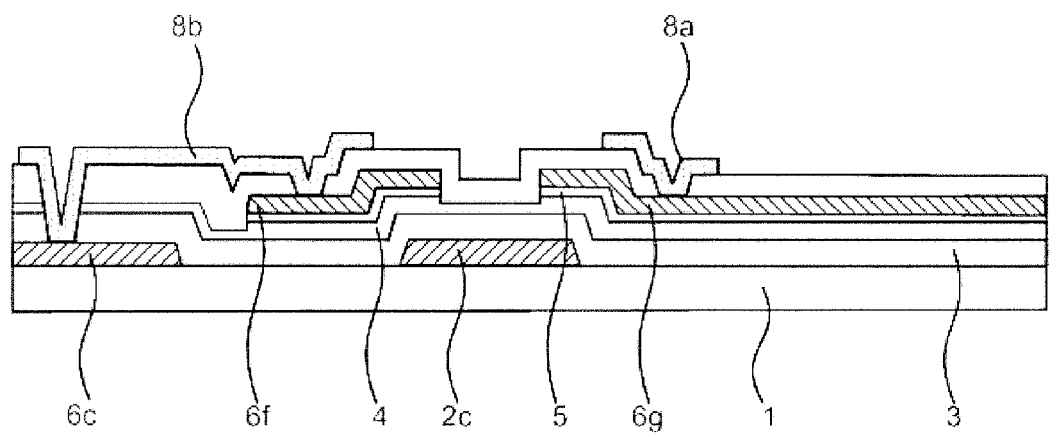

FIG. 9a is a partial top view schematically showing the structure of a TFT-LCD array substrate according to a third embodiment of the invention; and FIG. 9b is a side sectional view taken along a line C4-C4 in FIG. 9a. The third embodiment shown in FIG. 9a is different from the first embodiment shown in FIG. 1a in that: in the third embodiment, the first test line 6c and the second test line 2c are formed in the same patterning process; in the first embodiment, the first test line 6c and the source electrodes 6f and the drain electrodes 6g of the second TFTs are formed in the same patterning process.

The forming process for the third embodiment is similar to that for the first embodiment, except that the connecting holes over the first test line 6c pass through both the passivation layer 7 and the gate insulating film 3. The other aspects of the third embodiment are similar to the first embodiment, which are repeated herein.

In addition, for the array substrate shown in FIGS. 5a and 5b, the first test line may also be formed in the same patterning process as the second test line.

In each embodiment as mentioned above, the second patterning process employ a half-tone or grey tone mask, and the source electrodes, the drain electrodes and the active layer members (or islands) of the second TFTs are formed in the same patterning process. In this case, after being etched, the semiconductor layer used to form the active layer exists in the whole layer below the source/drain electrodes across the substrate, for example, as shown in FIG. 1b. However, it is also workable to employ normal masks rather than a half-tone or grey tone mask, in which case the source electrodes, the drain electrodes and the active layer members of the second TFTs can be formed by two patterning processes. In this case, after being etched, the semiconductor layer used to faun the active layer is etched into an "island" shape and located only at a position for forming the TFT (not shown in the figures). By taking the first embodiment as an example, the specific process is described as follows. On the substrate 1 with the patterns shown in FIG. 2a, a gate insulating layer thin film, a semiconductor layer thin film and a doped semiconductor layer thin film are deposited sequentially; the active layer members of the first and second TFTs are formed by a patterning process with a normal mask; then, a source/drain metal layer thin film is deposited on the substrate formed with the active layer members, and source electrodes and drain electrodes of the first and second TFTs, data lines, common electrode lines, and a first test line are formed by a patterning process with another normal mask.

The structure and the manufacturing method of the TFT-LCD array substrate according to the embodiments of the invention has been described above. However, the TFT-LCD array substrate according to the embodiment of the invention is not limited to the specific structure mentioned above. For example, when the first test line and the source electrodes of the second TFTs are formed on the same layer, the first test line and the source electrodes of the second TFTs may be formed integrally, so that the first connecting electrode is not necessary.

A manufacturing method for a TFT-LCD array substrate according to an embodiment of the invention may comprise the following steps.

Step 101, forming patterns including a gate line, a data line, a common electrode line, a first test line, a second test line, a source electrode and a drain electrode of a first TFT, an active layer member of the first TFT, a source electrode and a drain electrode of a second TFT, and an active layer member of the second TFT on a substrate, a part of the second test line constituting a gate electrode of the second TFT, and the first TFT being formed in a sub-pixel area defined by the gate line and the data line which are crossed with each other.

Step 102, forming a passivation layer on the substrate after Step 101, and forming patterns including a first connecting via hole over the first test line, a second connecting via hole over the source electrode of the second TFT, and a testing via hole over one end, which is adjacent to the second TFT, of the common electrode line by a patterning process.

Step 103, forming a transparent conductive film on a substrate after Step 102, forming patterns including a first connecting electrode and a testing electrode by a patterning process, a first test line being connected with the first connecting electrode through the first connecting via hole, the source electrode of the second TFT being connected with the first connecting electrode through the second connecting via hole, and the testing electrode being connected with the common electrode line through the testing via hole.

In Step 101, the source electrode and the drain electrode of the second TFT may be formed above the second test line. In addition, if the first test line and the source electrode of the second TFT are formed integrally, the step for forming the first connecting via hole and the second connecting via hole can be omitted in the Step 102, and the step forming the first connecting electrode can be omitted in the Step 103.

Hereinafter, several examples of the manufacturing method for the TFT-LCD array substrate according to the embodiment of the invention will be given.

A first example of the manufacturing method for a TFT-LCD array substrate according to the embodiment of the invention comprises the following steps.

Step 201, forming a gate metal thin film on a substrate, and forming patterns including a gate line, a first test line and a second test line by a patterning process with a normal mask.

Step 202, sequentially depositing a gate insulating layer thin film, a semiconductor layer thin film, a doped semiconductor thin film and a source/drain metal thin film on the substrate after Step 201, and forming a data line, common electrode strips of a common electrode line, source and drain electrodes of a first TFT, an active layer member of the first TFT, source and drain electrodes of a second TFT and an active layer member of the second TFT by a patterning process with a half tone or grey tone mask; a part of the second test line constituting a gate electrode of the second TFT, one end of the common electrode strip, which is adjacent to the second TFT, outside a display area being connected with the drain electrode of the second TFT.

Step 203, forming a passivation layer on the substrate after Step 202, and forming a first connecting via hole over the first test line, a second connecting via hole over the source electrode of the second TFT, a testing via hole over the common electrode strip outside the sub-pixel area and fourth connecting via holes over ends of the common electrode strips within the sub-pixel area by a patterning process with a normal mask.

Step 204, forming a transparent conductive thin film on the substrate after Step 203, and forming a first connecting electrode, a second connecting electrode and a testing electrode by a patterning process with a normal mask. The first test line is connected with the first connecting electrode through the first connecting via hole, and the source electrode of the second TFT is connected with the first connecting electrode through the second connecting via hole. The testing electrode is connected with the common electrode strip through the testing via hole. The common electrode line comprises a plurality of common electrode strips and a plurality of second connecting electrodes, and one common electrode strip is foamed within each sub-pixel area; the common electrode strips in two adjacent sub-pixel areas are connected with each other through the fourth connecting via holes and the intermediate second connecting electrode.

A second example of the manufacturing method for a TFT-LCD array substrate according to the embodiment of the invention comprises the following steps.

Step 301, forming a gate metal thin film on a substrate, and forming patterns including a gate line, a first test line and a second test line by a patterning process with a normal mask.

Step 302, sequentially depositing a gate insulating layer thin film, a semiconductor layer thin film, and a doped semiconductor thin film on the substrate after Step 301, and forming an active layer member of a first TFT and an active layer member of a second TFT by a patterning process with a normal mask.

Step 303, depositing a source/drain metal thin film on the substrate after Step 302, and forming a data line, common electrode strips of a common electrode line, source and drain electrodes of the first TFT, and source and drain electrodes of the second TFT by a patterning process with a normal mask; a part of the second test line constituting a gate electrode of the second TFT, one end of the common electrode strip which is adjacent to the second TFT outside the sub-pixel area being connected with the drain electrode of the second TFT.

Step 304, forming a passivation layer on the substrate after Step 202, and forming a first connecting via hole over the first test line, a second connecting via hole over the source electrode of the second TFT, a testing via hole over the common electrode strip outside the sub-pixel area and fourth connecting via holes over ends of the common electrode strips within a sub-pixel area by a patterning process with a normal mask.

Step 305, forming a transparent conductive thin film on the substrate after Step 304, and forming a first connecting electrode, a second connecting electrode and a testing electrode by a patterning process with a normal mask. The first test line is connected with the first connecting line through the first connecting via hole, the source electrode of the second TFT is connected with the first connecting electrode through the second connecting via hole. The testing electrode is connected with the common electrode strip of the common electrode line through the testing via hole. The common electrode line comprises a plurality of common electrode strips and a plurality of second connecting electrodes, and one common electrode strip is formed within each sub-pixel area; in one row, the common electrode strips in two adjacent sub-pixel areas are connected with each other through the fourth connecting via holes and the intermediate second connecting electrode.

A third example of the manufacturing method for a TFT-LCD array substrate according to the embodiment of the invention comprises:

Step 401, forming a gate metal thin film on a substrate, and forming patterns including a gate line, a first test line, a second test line and a common electrode line by a patterning process with a normal mask.

Step 402, depositing a gate insulating layer thin film, a semiconductor layer thin film, a doped semiconductor thin film and a source/drain metal thin film on the substrate after Step 401, and forming a data line, source and drain electrodes of a first TFT, an active layer member of the first TFT, source and drain electrodes of a second TFT and an active layer member of the second TFT by a patterning process with a half tone or grey tone mask; a part of the second test line constituting the gate electrode of the second TFT.

Step 403, forming a passivation layer on the substrate after Step 402, and forming a first connecting via hole over the first test line, a second connecting via hole over the source electrode of the second TFT, a third connecting via hole over the drain electrode of the second TFT, and a testing via hole over the common electrode line by a patterning process with a normal mask.

Step 404, forming a transparent conductive thin film on the substrate after Step 403, forming a first connecting electrode and a testing electrode by a patterning process with a normal mask. The first test line is connected with the first connecting electrode through the first connecting via hole, the source drain of the second TFT is connected with the first connecting electrode through the second connecting via hole. The testing electrode is connected with the common electrode line through the testing via hole, and is also connected with the drain electrode of the second TFT through the third connecting via hole.

A fourth example of the manufacturing method for a TFT-LCD array substrate according to the embodiment of the invention comprises:

Step 501, forming a gate metal thin film on a substrate, and forming patterns including a gate line, a first test line, a second test line and a common electrode line by a patterning process with a normal mask.

Step 502, depositing a gate insulating layer thin film, a semiconductor layer thin film, and a doped semiconductor thin film on the substrate after Step 501, and fainting active layer members of a first TFT and a second TFT by a patterning process with a normal mask.

Step 503, depositing a source/drain metal thin film on the substrate after Step 502, forming a data line, source and drain electrodes of the first TFT, and source and drain electrodes of the second TFT by a patterning process with a half tone or grey tone mask; a part of the second test line constituting the gate electrode of the second TFT.

Step 504, forming a passivation layer on the substrate after Step 503, and forming a first connecting via hole over the first test line, a second connecting via hole over the source electrode of the second TFT, a third connecting via hole over the drain electrode of the second TFT and a testing via hole over the common electrode line by a patterning process with a normal mask.

Step 505, forming a transparent conductive thin film on the substrate after Step 504, and forming a first connecting electrode and a testing electrode by a patterning process with a normal mask. The first test line is connected with the first connecting line through the first connecting via hole, the source electrode of the second TFT is connected with the first connecting electrode through the second connecting via hole. The testing electrode is connected with the common electrode line through the testing via hole, and is also connected with the drain electrode of the second TFT through the third connecting via hole.

In the above embodiments, the common electrode line and the data line are formed in different patterning processes; therefore, the common electrode line cannot employ the structure of common electrode strips combined with the second connecting electrode.

A fifth example of the manufacturing method for a TFT-LCD array substrate according to the embodiment of the invention comprises the following steps.

Step 601, forming a gate metal thin film on a substrate, and forming patterns including a gate line and a second test line by a patterning process with a normal mask.

Step 602, sequentially depositing a gate insulating layer thin film, a semiconductor layer thin film, a doped semiconductor thin film and a source/drain metal thin film on the substrate after Step 601, and forming a data line, common electrode strips of a common electrode line, a first test line, source and drain electrodes of a first TFT, an active layer member of the first TFT, source and drain electrodes of a second TFT and an active layer member of the second TFT by a patterning process with a half tone or grey tone mask; a part of the second test line constituting a gate electrode of the second TFT, and one end of the common electrode strip which is adjacent to the second TFT outside a display area being connected with the drain electrode of the second TFT.

Step 603, forming a passivation layer on the substrate after Step 602, and forming a first connecting via hole over the first test line, a second connecting via hole over the source electrode of the second TFT, a testing via hole over the common electrode strip outside the sub-pixel area and fourth connecting via holes over ends of the common electrode strips within the sub-pixel area by a patterning process with a normal mask.

Step 604, forming a transparent conductive thin film on the substrate after Step 603, and forming a first connecting electrode, a second connecting electrode and a testing electrode by a patterning process with a normal mask. The first test line is connected with the first connecting electrode through the first connecting via hole, and the source electrode of the second TFT is connected with the first connecting electrode through the second connecting via hole. The testing electrode is connected with the common electrode strip through the testing via hole. The common electrode line comprises a plurality of common electrode strips and a plurality of second connecting electrodes, and one common electrode strip is formed within each sub-pixel area; among sub-pixel areas in one row, the common electrode strips in two adjacent sub-pixel areas are connected with each other through the fourth connecting via holes and the intermediate second connecting electrode.

In the fifth example, the first test line and the source/drain electrodes of the second TFT is formed in the same patterning process. In the second example, the third example and the fourth example, the first test line may also be formed in a patterning process the same as that of the source/drain electrodes of the second TFT.

In the manufacturing method for a TFT-LCD array substrate according to the embodiment of the invention, the second TFTs connected with the common electrode lines are formed. Each second TFT can be turned on when a turn-on voltage is applied to the second test line; therefore, the test voltage over the first test line can be applied to each common electrode line. If it is needed to test a certain common electrode line individually, then no turn-on voltage is applied to the second test line and each second TFT is turned off. At this time, the test voltage can be applied to the certain common electrode line individually through the corresponding testing electrode. The TFT-LCD array substrate according to the embodiment of the invention can use some of the common electrode lines for partial test while ensure the normal usage of the TFT-LCD array substrate.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A thin film transistor liquid crystal display (TFT-LCD) array substrate, comprising:

a display area comprising a gate line, a data line and a common electrode line, a pixel electrode and a first thin film transistor (TFT) formed in each sub-pixel area defined by the gate line and data line which are crossed with each other; and a test area located at the peripheral of the display area and comprising a first test line, a second test line, a testing electrode and a second TFT, and the common electrode line extending to the test area from the display area, wherein a part of the second test line constitutes a gate electrode of the second TFT; the source electrode of the second TFT is electrically connected with the first test line; a drain of the second TFT is electrically connected with the common electrode line; and the common electrode line is connected with the testing electrode, wherein the common electrode line, the data line, and the source and drain electrodes of the second TFT are formed on a same layer, the common electrode line comprises a plurality of common electrode strips and a plurality of second connecting electrodes with one common electrode strip formed in each sub-pixel area; among the sub-pixel areas in one row, the common electrode strips in two adjacent sub-pixel areas are connected with an intermediate second connecting electrode; and one end of the common electrode strip in the test area is connected with the drain electrode of the second TFT, and wherein the common electrode line and the data line cross with each other, and the second connecting electrodes are provided at intersections between the common electrode line and the data line, and wherein the common electrode strips are located in a same layer as the data line and not connected with the data line, and the second connecting electrodes are located in a different layer from the common electrode strips and cross over the data line so as to connect common electrode strips in adjacent sub-pixel areas.

2. The TFT-LCD array substrate of claim 1, wherein the first test line and the source electrode of the second TFT are formed integrally, or the first test line is connected with the source electrode of the second TFT through a via hole over the first testing electrode, a via hole over the source electrode of the second TFT, and a first connecting electrode.

3. The TFT-LCD array substrate of claim 1, wherein the first test line and the source and drain electrodes of the second TFT are formed on a same layer.

4. The TFT-LCD array substrate of claim 1, wherein the first test line, the second test line, and the gate line are formed on a same layer.

5. The TFT-LCD array substrate of claim 1, wherein the second test line, the common electrode line and the gate line are formed on a same layer, and the data line and the source and drain electrodes of the second TFT are formed on a same layer.

6. The TFT-LCD array substrate of claim 5, wherein a testing via hole is formed over one end, which is adjacent to the second TFT, of the common electrode line, a third connecting via hole is formed over the drain electrode of the second TFT, the common electrode line is connected with the testing electrode through the testing via hole, and the drain electrode of the second TFT is connected with the testing electrode through the third connecting via hole.

7. The TFT-LCD array substrate of claim 1, wherein the common electrode strip adjacent to the second TFT and the drain electrode of the second TFT are formed integrally.

8. The TFT-LCD array substrate of claim 1, wherein a fourth connecting via hole is formed over each end of each common electrode strip in the display area, and in the sub-pixel areas in one row, the common electrode strips in two adjacent sub-pixels are connected with each other through the fourth connecting via holes.

* * * * *